United States Patent [19]

Masumura et al.

[11] Patent Number: 5,790,252
[45] Date of Patent: Aug. 4, 1998

[54] METHOD OF AND APPARATUS FOR DETERMINING RESIDUAL DAMAGE TO WAFER EDGES

[75] Inventors: Hisashi Masumura; Hideo Kudo, both of Nishigou-mura; Shingo Sumie, Kobe; Hidetoshi Tsunaki, Kobe; Yuji Hirao, Kobe; Noritaka Morioka, Kobe, all of Japan

[73] Assignee: Shin-Etsu Handotai Co., Ltd., Tokyo, Japan

[21] Appl. No.: 720,065

[22] Filed: Sep. 27, 1996

[30] Foreign Application Priority Data

Sep. 27, 1995 [JP] Japan .................. 7-273489

[51] Int. Cl.$^6$ ........................................ G01B 9/02
[52] U.S. Cl. ........................... 356/357; 356/432
[58] Field of Search ........................ 356/351, 357, 356/432; 73/655, 657

[56] References Cited

U.S. PATENT DOCUMENTS 5,062,715 11/1991 Nakata et al. ............... 356/432 T
5,182,615 1/1993 Kunosawa et al. ............ 356/400

*Primary Examiner*—Samuel A. Turner
*Attorney, Agent, or Firm*—Evenson, McKeown, Edwards & Lenahan P.L.L.C.

[57] ABSTRACT

The invention seeks to permit evaluation of edge portion of like inclined surfaces of wafer with high accuracy without the conventional destruction process based on the selective etching process but with the contact-free, non-destructive and high accuracy optical acoustical process. To this end, the invention features determination of residual damages as crystal damages caused to wafer edge in an optical acoustical process, which comprises the steps of causing a measurement probe to face each of three exciting laser beam irradiation points on upper and lower inclined surfaces and at an accurate end of an edge portion of a semiconductor wafer, and determining a thermal response induced by the exciting laser beam by a laser interference process.

2 Claims, 3 Drawing Sheets

1

METHOD OF AND APPARATUS FOR DETERMINING RESIDUAL DAMAGE TO WAFER EDGES

BACKGROUND OF THE INVENTION

1. Field of the Invention

This invention relates to a method of and an apparatus for contact-free and non-destructive determination of minute crystal damages, which are residual damages caused to edge surface layer of a semiconductor wafer (hereinafter referred to as wafer) by chamfering, lapping or like machining and, more particularly, a method of and an apparatus for determining residual damages to wafer edge by measuring an optical thermal displacement (or thermal expansion), which is a thermal response generated on the wafer surface, whereby the exciting laser beam which light strength is modulated is irradiated on the wafer surface, by using a heterodyne interferometer.

2. Description of the Related Art

When a wafer is machined, for instance chamfered or lapped, crystal damages up to the depth of about 10 μm from the wafer surface, are caused to the wafer by the machining step. Such crystal damages are removed in the next step of etching. However, these crystal damages may not be perfectly removed and residual damages are left due to insufficient etching or inadequacy of the step.

In a usual method of determining the residual crystal damages caused to, for instance, a Si wafer, the crystal property of Si is evaluated by making crystal defects visible through selective etching. This is done by utilizing the fact that the crystal damage region and other region, i.e., sound region free from crystal damage, are etched at different rates.

Particularly, in a method of determining the crystal property by detecting minute crystal damages found as residual damages caused to an wafer edge surface layer, the cleavage of bearing <110> of Si is utilized. Specifically, the wafer edge is cleaved into halves, and the section is etched to examine the defect distribution in the depth direction.

In this method, however, it is difficult to be cleaved the wafer edge without causing chipping thereof or damages thereto. It has therefore been difficult to determine residual crystal damages accurately.

A recently proposed method of determining crystal damages caused to the wafer surface, utilizes well-known optical acoustic effects.

That is, when the exciting laser beam of which light strength is modulated, is irradiated on the wafer surface, the thermal response is generated accompanied with optical thermal displacement (or thermal expansion) in response to thermal property on the wafer surface by generation of heat or radiation of heat periodically.

FIGS. 6(A) and 6(B) show thermal response of Si wafer surfaces to exciting laser beam irradiation. FIG. 6(A) shows the case of a wafer surface without crystal damages or like crystal defects. With crystal damages or like crystal defects present on the wafer surface, the thermal diffusion is reduced as shown in FIG. 6(B). In other words, optical thermal displacements Ya and Yb are Ya<Yb.

When the exciting light is provided from a laser diode and has a wavelength of 809 nm, the depth of its intrusion is about 10 μm and can sufficiently cover the depth of the region, in which the residual damages or residual defects are present.

FIG. 1 shows a method of sample wafer evaluation through measurement of induced thermal response, which is the minute optical thermal displacement as noted above, by using a high accuracy, high sensitivity heterodyne interferometer. The optical system and signal processing system for the method of determining residual damages to wafer edge according to the invention, have the same meaning, and FIG. 1 is used for describing the construction for carrying out the method of determination. FIG. 1, however, does not show prior art but shows the invention, and it specifically shows the constructions of the optical system and the signal processing system.

As shown in the Figure, a He-Ne laser beam 10 with a wavelength of 633 nm is used as probe laser beam, and an acoustical optical modulator 11 produces the beam with two frequency components. One of the component frequency beams is led by a semipermeable mirror 12 to irradiate an exciting light irradiation position 13 of sample wafer surface (i.e., a wafer edge 31 in the illustrated case) so as to obtain a reflected beam 20. The beam with other frequency component beam is led to irradiate a reference mirror 14 so as to obtain a reflected beam 21 therefrom. A photoelectric transducer 15 produces an interference signal 23 from the reflected beams 20 and 21.

The probe laser beam for irradiating on the wafer surface to obtain the reflected beam 20, is phase modulated by periodic optical thermal displacement generated by an exciting laser beam 22 shown by a dashed line. The interference signal 23 contains data about the amplitude Y of the optical thermal displacement (as shown in FIG. 3), and also it contains noise generated due to such causes as external disturbance oscillations or swaying of air.

Accordingly, an oscillator signal 24 from an oscillator 18 for intensity modulating the exciting laser beam 22 and the interference signal 23 are coupled to a signal discriminator 16 to take out an external disturbance signal 25, and the external disturbance signal 25 is removed from the interference signal 23 in a lock-in amplifier 17, thus obtaining an optical thermal displacement signal 26. The optical thermal displacement signal 26 thus obtained is used in a CPU 27 to determine the crystal damages.

With this optical thermal displacement measurement method, a resolution of 0.1 pm (i.e., 0.001 nm) is obtainable. The measurement region that is obtainable, although varying in dependence on the thermal diffusion, has a diameter ranging form 10 to 40 μm and a depth of 10 μm as noted above.

The above wafer evaluation by the selecting etching process in the prior art requires destroying the sample, which is time-consuming. In addition, damage is caused to the wafer edge when dividing the sample. This is undesired for accurate determination of crystal damages to the wafer edge.

The above method utilizing the optical acoustic effects, permits non-destructive contact-free evaluation which was impossible with the above etching process. Besides, in this method the measurement depth coverage is sufficient to cover the residual defect region where residual damages are present, and also as for the accuracy the resolution is 0.1 pm. This method of determination, however, is applicable to the determination of residual damages on the principal surface of wafer, and is not suited for residual damage determination with respect to the wafer edge or like inclined wafer surfaces.

SUMMARY OF THE INVENTION

An object of the invention is to permit evaluation of wafer edge portion or like inclined surfaces of wafer that is, residual damage of edge portion with high efficiency without the conventional destructive process based on the selective etching process but with the contact-free, non-destructive and high accuracy optical acoustical process.

Another object of the invention is to obtain efficient wafer edge residual damage determination by adopting the optical acoustical measuring process, based on laser interference measurement which is suitable from the standpoint of the accuracy, measurement range and measurement depth.

A further object of the invention is to provide an apparatus for determining residual damages caused to wafer edge, which permits effective utilization of the optical thermal displacement measuring process.

To attain the above objects, the invention features determination of residual damages as crystal damages caused to wafer edge by an optical acoustical measuring process, which comprises the steps of causing a measurement probe to face each of three exciting laser beam irradiation points on upper and lower inclined surfaces and at an arcuate end of the edge portion of the semiconductor wafer, and determining a thermal response induced by the exciting laser beam by a laser interference process.

In the optical acoustical measuring process, the measurement prove provides a He-Ne laser beam, the beam with two frequency components being produced from the He-Ne laser beam, one of the two frequency component beams being caused to irradiate the thermal response points induced from each exciting laser beam irradiation, the beam with the other frequency component being caused to irradiate a reference mirror for phase modulation, an interference signal containing amplitude data of the thermal response being obtained from reflected beams based on the beam with two frequency component.

As an apparatus suitable for carrying out the above method according to the invention, an apparatus for determining residual damages as crystal damages caused to wafer edge, which comprises an optical thermal displacement gauge, including a sample stage and an acoustical optical modulation for producing the beam with two frequency components from a He-Ne laser beam as a probe laser beam, one of the beam with two frequency components being caused to irradiate an exciting laser beam irradiation point as a measurement point on the surface of a wafer on the sample stage for obtaining an interference signal from the beam from the exciting beam irradiation point and the beam with other frequency component;

the sample stage including an X-Y stage provided on a base, an θ stage for supporting a sample such as to be capable of being rotated about an θ axis, and an α stage provided on the X-Y stage and capable of being rotated, while supporting the θ stage, about an a axis parallel to an X axis passing through a point in the proximity of the above measurement point.

As mentioned in claim 5, it could be accepted that the above sample stage including an X-Y stage provided on a base, an θ stage for supporting a sample such as to be capable of being rotated about an θ axis, and an α stage provided on the X-Y stage and capable of being rotated, while supporting the θ stage, about an a axis parallel to an above X axis, and a moving means capable of moving a probe (measuring element) of the optical thermal displacement gauge in the directions of an optical path axis of the laser beam.

In this case, as mentioned in the embodiment later, it is accepted also but has no sense of limiting just such constitution that the above sample stage including an X-Y stage provided on a base, an θ stage for supporting a sample such as to be capable of being rotated about an θ axis, and an α stage provided on the X-Y stage and capable of being rotated, while supporting the θ stage, about an α axis parallel to an X axis, the α axis passing through an imaginary center connecting an above plurality of measurement points or through a point in the proximity of the imaginary center, and as occasion demands, a moving means capable of moving probe (measuring element) of the optical thermal displacement gauge in the direction of an optical path axis of the laser beam.

Figure 1:
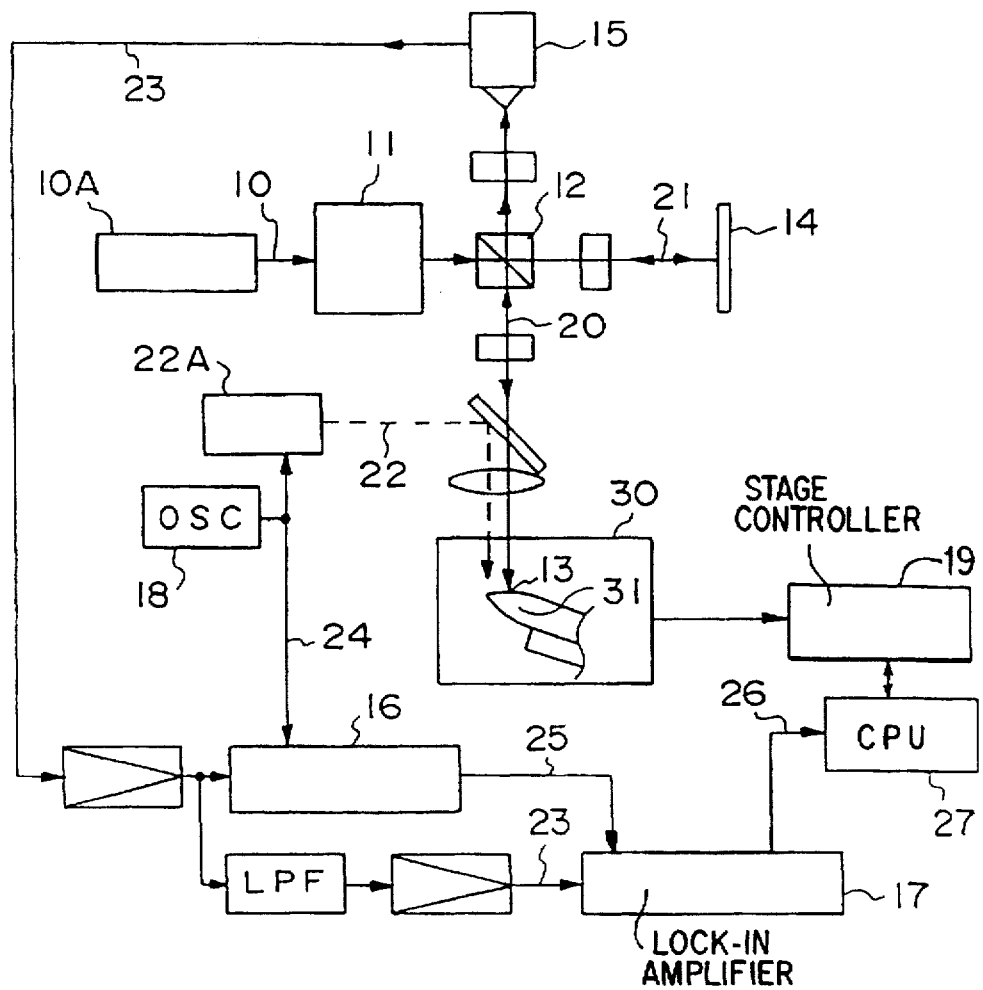
FIG. 1 is a schematic representation of the construction for carrying out the method of determining residual damages to wafer edge according to the invention.

As reference numerals or symbols in the Figures: 10: He-Ne laser beam (probe laser beam), 10A: measurement probe, 11: acoustical optical modulator, 12: semipermeable mirror, 14: reference mirror, 15: photoelectric transducer, 16: signal discriminator, 17: lock-in amplifier, 20, 21: reflected beam, 22A: laser diode, 22: exciting laser beam, 23: interference signal, 25: external disturbance signal, 26: optical thermal displacement signal, 30: sample stage, 31: wafer edge, 32: wafer, 50: X-Y stage, 55: θ stage, 56: imaginary center, 57: rotating mechanism, 58: moving means.

DETAILED DESCRIPTION OF THE PREFERRED EMBODIMENT

An embodiment of the invention will now be described with reference to the drawings. Unless particularly stated, the sizes, shapes, relative dispositions, etc. of components described in connection with the embodiment, have no sense of limiting the scope of the invention but are merely exemplary.

Figure 2:
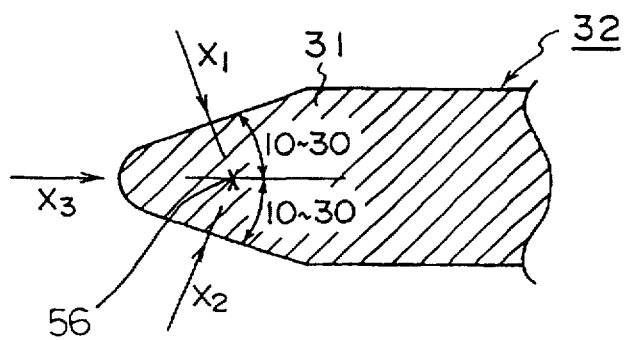
FIG. 2 is a fragmentary sectional view, to an enlarged scale, showing wafer edge positions corresponding to probe laser beam shown in FIG. 1.
Figure 3:
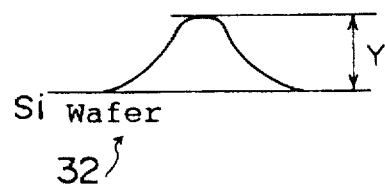
FIG. 3 is a view showing the amplitude of optical thermal displacement induced on wafer surface by exciting laser beam irradiation.
Figure 4:
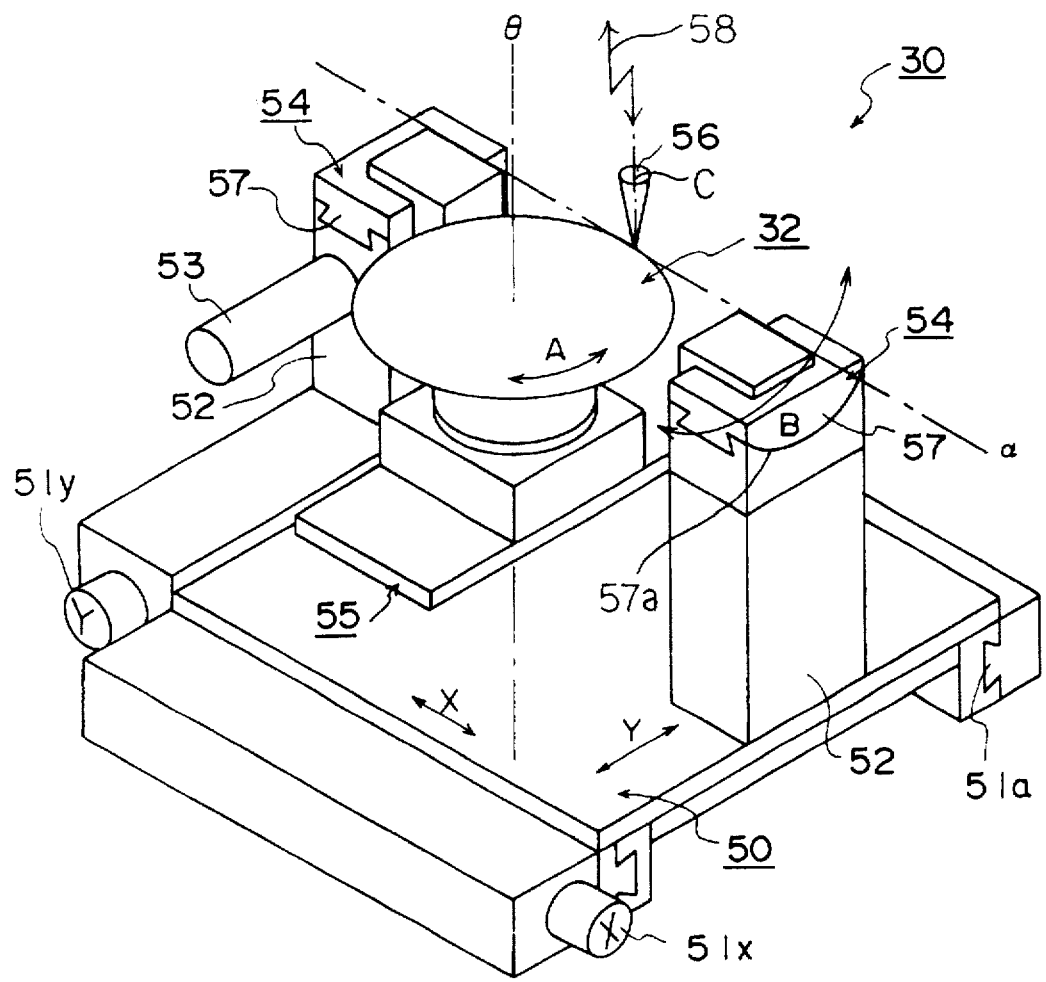
FIG. 4 is a schematic perspective view showing a sample stage of an apparatus for determining residual damages to wafer edge according to the invention.

FIG. 1 is a schematic view showing the construction for carrying out the method of determining residual damages to wafer edge according to the invention, FIG. 2 is a fragmentary sectional view, to an enlarged scale, wafer edge positions corresponding to probe laser beam shown in FIG. 1, FIG. 3 is a view showing the amplitude of optical thermal displacement induced by exciting laser beam irradiation, and FIG. 4 is a schematic perspective view showing an apparatus for determining residual damages to wafer edge according to the invention.

As shown in FIGS. 1 and 2, in the wafer edge residual damage determination method according to the invention, a measurement probe 10A of an optical system structure for the method is disposed on and perpendicularly to the wafer edge 31 at positions X1 and X2 on upper and lower inclined surfaces and at position X3 on an arcuate end for predetermined measurement, thus permitting determination of residual damages caused to wafer edge.

As shown in FIG. 1, the wafer edge residual damage determination process in this embodiment is carried out using a system consisting of an optical system and a signal processing system. The optical system mainly comprises the measurement probe 10A for forming a probe laser beam, i.e., a He-Ne laser beam 10, an acoustical optical modulator 11 for producing the beam with two frequency components from the laser beam 10, a semipermeable mirror 12 for causing irradiation of the wafer edge 31 at an exciting laser beam irradiation position 13 by one of the beam with frequency components to obtain a reflected beam 20 and also causing irradiation a reference mirror 14 by the beam with other frequency component to obtain a reflected beam 21, a reference mirror 14, and a laser diode 22A for causing irradiation of an exciting laser beam 22. A photoelectric transducer 15 in a signal processing system to be described later, produces an interference signal 23 containing external disturbance from the reflected beams 20 and 21.

The signal processing system comprises a photoelectric transducer 15 for forming an interference signal 23, a signal discriminator 16 for discriminating an external disturbance signal 25 from an oscillator signal 24 from an exciting light oscillator 18 and the interference signal 23, a lock-in amplifier 17 for removing the external disturbance signal from the interference signal 23 and thus outputting an optical thermal displacement signal 26 having optical thermal displacement amplitude data, and a CPU 27 for determining crystal damages caused to the wafer edge from the optical thermal displacement signal 26. Designated at 19 is a stage controller, and at LPF is a low-pass filter for removing the external disturbance signal.

The exciting laser beam 22 is intensity modulated by the oscillator 18, and a periodical optical thermal displacement Y as shown in FIG. 3 is generated at the wafer edge surface locality irradiated by the exciting laser beam 22 shown a dotted line. Thus, the reflected beam 20 is phase modulated by periodic optical thermal displacement, and the interference signal 23 has optical thermal displacement amplitude data and is inputted as an optical thermal displacement signal 26 to the CPU 27.

By setting the wavelength of the He-Ne laser beam 10 to 663 nm and using a laser diode 22A with a wavelength of 809 nm for the exciting laser beam 22, an optical thermal displacement resolution of 0.1 pm was obtained.

The measurement region diameter that was obtained was 10 to 40 μm, and the exciting light intrusion depth obtained was about 10 μm.

The wafer edge residual damage determination apparatus according to the invention, thus is an optical thermal displacement gauge, which, for determining residual damages caused to wafer edge, has a sample stage 30 and also has an acoustical optical modulator, which uses a He-Ne laser providing a probe laser beam and produces from this beam with two frequency component, one thereof being caused to irradiate an exciting laser beam irradiation point as measurement point on the surface of a wafer on the sample stage, the beam with other frequency component being caused to irradiate the reference mirror, thus obtaining the interference signal from the resultant two reflected beams.

As shown in FIG. 4, the sample stage 30 has an X-Y stage 50, an α stage 54, and a θ stage 55 and moving means 58 which is capable of moving a measurement probe (i.e., a measurement element) 10A of the optical thermal displacement gauge in the directions of an optical path axis of the laser beam.

The X-Y stage 50 is provided on a base for sliding in X axis direction and Y axis direction, and has an X axis drive motor 51x, a Y axis drive motor 51y, and a guide 51a.

The above α stage 54 comprises the posts 52, 52 which are erected from X axis right and left side portions of the X-Y stage 50, the rotating mechanism 57, 57 which are capable of being rotated in the direction of arrow B about an X axis parallel to a α axis, which passes through an imaginary center 56 (see FIG. 2) connecting a plurality of measurement points X1, X2 and X3 or through a point in the proximity of the imaginary center, such as to permit rotation of the θ stage 55 for wafer loading provided on the posts 52, 52 and the rotating motor 53.

The θ stage 55 is supported on the α stage 54 and capable of being rotated together with a sample wafer 32 carried by it in the directions of arrows A.

Moving means 58 which moves the measurement probe (or measurement element) 10A of the optical thermal displacement gauge in the direction of laser beam path axis C, comprises a rack-and-pinion mechanism driven by a well-known drive motor and is well known in the art, and it is not shown.

In the use of the sample stage 30, after setting the wafer 32 on the θ stage 55, the X-Y stage 50 is moved in Y and X axis directions, whereby the center of the rotating mechanism 57 is brought to be coincident with the α axis, and also the intended wafer edge is operated so as to be brought on the line connecting the measurement point X1 with an imaginary center 56 by the rotation of the θ stage 55. Then, the rotating mechanism 57 of the α stage 54 and the moving means 58 are operated, thus causing movement of the measurement probe (or measurement element) 10A in the direction of the laser beam path axis C, for example such as to rotate the axis C of the measurement probe 10 A at the measurement point of edge surface at X1 portion to be coincident with X1 direction and to retreat the measurement probe (or measurement element) 10A by the moving means 58, as shown in FIG. 2.

The above explanation is in connection with the wafer edge portion having sectional phase as shown in FIG. 2 but even though the sectional phase is accurate, it is possible to determine in the same manner. When the sectional phase of wafer edge portion is accurate, the moving means 58 is not necessarily to move the measurement probe 10A in the direction of the laser path axis C.

The rotating mechanisms 57 and the moving means 58 are operated likewise with respect to the other positions X2 and X3 as well. In this way, a status of measurement is provided, in which the measurement surface exactly faces the measurement probe 10A, and the axis of the probe 10A is coincident with the X2, X3 direction.

Even when the measurement positions of X1 to X3 are not coincident with an arcuate face 57a rotating mechanism 57, the axis of the probe 10A can be readily made coincident with the positions X1 to X3 by combining the rotating mechanism 57 and moving means 58 with moving means 56 for moving the probe 10A in the beam path directions.

EXAMPLE

Eight Si wafer having a diameter of 150 mm, obtained by raising in a CZ process with a crystal bearing <100>, followed by cutting, lapping and chamfering, were etched for different periods of time to provide etching stock removal of 5 to 40 µm. and then they were cleaned and dried.

Then, each of the Si wafers with the various etching margins was set on the θ stage in the sample stage in the residual damage determination apparatus according to the invention. Then, the θ stage was rotated to bring the wafer edge portion for the wafer damage determination to a position right underneath the measurement point. Then, the α stage was rotated by operating the rotating mechanisms to bring the position X1 on the tilt surface of the wafer to a position to face at right angle the laser beam irradiating from the measurement probe located at the measurement point as shown in FIG. 2.

The measurement was made for the three points of the wafer noted above.

Figure 5:
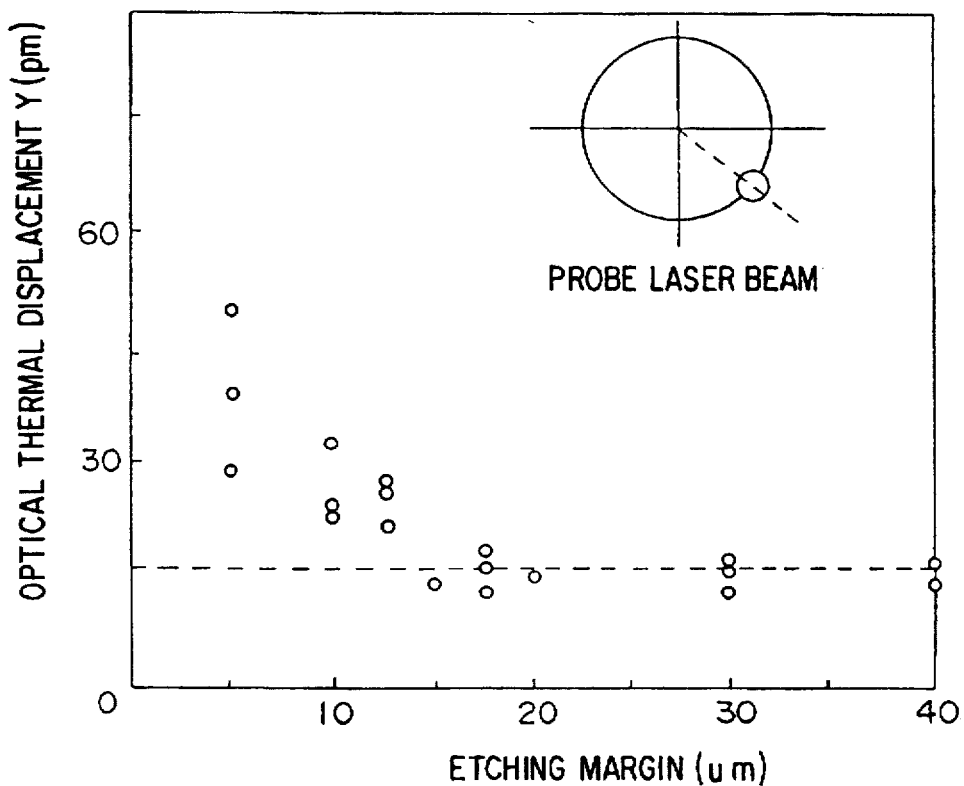
FIG. 5 is a view showing results of damage determination with the method of determining residual damages to wafer edge according to the invention.
Figure 6A:
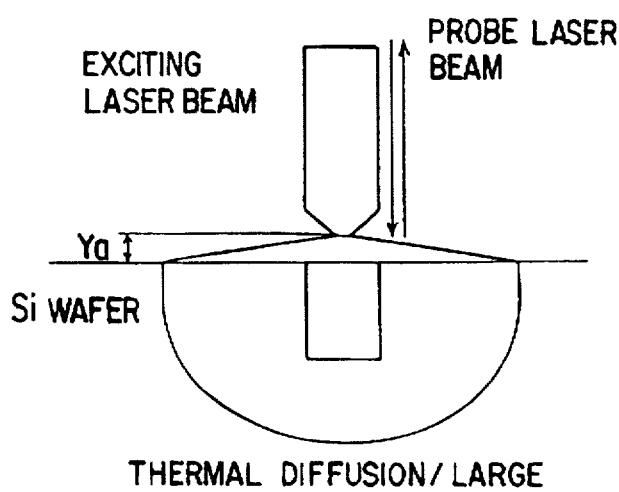
FIGS. 6(A) and 6(B) are schematic views showing thermal response of Si wafer surface to exciting laser beam irradiation, FIG. 6(A) showing a case with crystal damages, FIG. 6(B) showing a case with crystal damages.
Figure 6B:
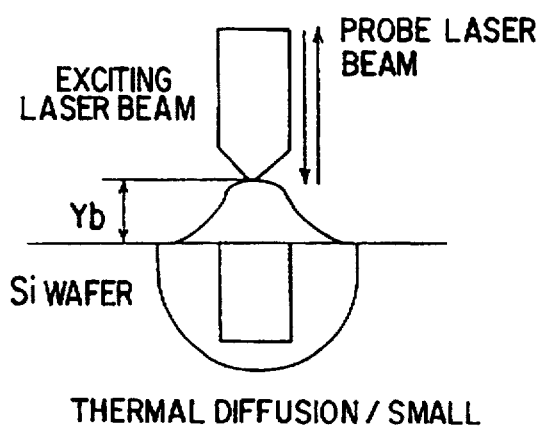

FIG. 5 shows results of measurements. In the graph, the abscissa is taken for the etching margin in µm, and the ordinate is taken for the optical thermal displacement in pm.

As shown, the optical thermal displacement becomes constant when the etching margin exceeds about 18 µm. This means that no residual damage is present at distances of 18 µm and above from the wafer surface.

However, it is seen at a portion of lower than 18 µm that the optical thermal displacement, i.e., the value of Y shown in FIG. 3, is the greater, the small is the etching margin, that is, the degree of residual damages caused to the wafer surface layer is the greater.

While residual damages caused to the chamfered portion of wafer cause dislocation in a thermal process of a device according to the invention, it is possible to generate a wafer free from generation of dislocation in the above thermal process by beforehand examination according to the invention.

As has been shown in the foregoing, according to the invention it is possible to obtain evaluation of edge portion or like inclined surfaces of wafer, that is, residual damage of edge portion, with high efficiency without the conventional destructive process based on the selective etching process but with the contact-free, non-destructive and high accuracy optical acoustical measuring process.

Particularly, according to the invention laser interference determination which is suitable from the standpoints of the accuracy, measurement range and measurement depth, is adopted in the optical acoustical determination process for effective determination of residual damages caused to the wafer edge.

According to the invention, it is also possible to provide a wafer edge residual damage determination apparatus, which can effectively utilize the optical thermal displacement measuring process.

And especially according to the invention, it is a matter of cause that wafer edge portion is measured at a plurality of measurement points like X1, X2, X3, and the result data which is measured not only at the individual measurement points, but also X1, X2, X3 are data-processed, consequently it is possible to determine the damage total evaluation at the wafer edge portion (chamfering portion).

What is claimed is:

1. A method of determining residual damages as crystal damages caused to wafer edge in an optical acoustical process comprising the steps of causing a measurement probe to face each of three exciting laser beam irradiation points on upper and lower inclined surfaces and at an arcuate end of an edge portion of a semiconductor wafer, and determining a thermal response induced by the exciting laser beam by a laser interference process.

2. The wafer edge residual damage determination method according to claim 1, wherein the measurement probe comprises an optical thermal displacement gauge which provides a He-Ne laser beam in the optical acoustical measuring process, said He-Ne laser beam having two frequency components, one of the two frequency components being caused to irradiate a reference mirror, and the other frequency component being caused to irradiate the thermal response points induced by each exciting laser beam irradiation for phase modulation, and wherein an interference signal containing amplitude data of the thermal response is obtained from reflected beams based on the phase difference between reflections of the two frequency components.

* * * * *